United States Patent [19]
Hill et al.

[11] Patent Number: 5,603,445
[45] Date of Patent: Feb. 18, 1997

[54] ULTRASONIC WIRE BONDER AND TRANSDUCER IMPROVEMENTS

[76] Inventors: William H. Hill, 36211 Pala del Norte Rd., Pala, Calif. 92059; Joseph E. Donner, 308 Encino Dr., Vista, Calif. 92083

[21] Appl. No.: 201,303

[22] Filed: Feb. 24, 1994

[51] Int. Cl.$^6$ .................................................. B23K 1/06
[52] U.S. Cl. .................... 228/4.5; 228/1.1; 228/180.5; 228/904
[58] Field of Search ................... 228/110.1, 4.5, 228/180.5, 904, 1.1

[56] References Cited

U.S. PATENT DOCUMENTS

| | | | |
|---|---|---|---|
| 4,326,115 | 4/1982 | Bartholet et al. | 228/4.5 |
| 5,142,117 | 8/1992 | Hoggatt et al. | 228/110.1 |
| 5,147,082 | 9/1992 | Krause et al. | 228/110.1 |
| 5,201,454 | 4/1993 | Alfaro et al. | 228/4.5 |
| 5,385,288 | 1/1995 | Kyomasu et al. | 228/1.1 |

*Primary Examiner*—Richard K. Seidel
*Assistant Examiner*—Jeanne M. Elpel

[57] ABSTRACT

Improved ultrasonic wire bonders, and improvements to ultrasonic wire bonding transducers that are used with such ultrasonic wire bonders. The improvements to the ultrasonic wire bonding transducer includes driver-node mounting of the transducer and a clamping arrangement for a bonding tool in the transducer. The driver-node mounting of the transducer is achieved by mounting it in the ultrasonic bonder such that a ¾—wavelength distance is created between a mounting bracket of the transducer and a distal end of the transducer at which the bonding tool is disposed. As a result, vibrational problems caused by the transducer not being located at the node are eliminated. The driver-node mounting aspect of the present invention provides a shorter overall transducer and concentrates the mass at the driver end for less tool impact, and reduces manufacturing variables related to achieving a one-half wavelength distance between the driver node and the transducer node. The mounting arrangement is achieved by using a set screw, and more particularly a soft point set screw, opposite a drilled-out back wall of the transducer. The set screw directly secures the bonding tool or engages a clamping shoe that radially secures the bonding tool to the end of the transducer. As a consequence, rigid clamping of the bonding tool is achieved. Therefore, the clamping force exerted on the bonding tool is in line with the direction of ultrasonic motion imparted to the bonding tool. The present clamping arrangement improves the transfer of ultrasonic energy that excites the bonding tool into transverse (flexural) vibration.

21 Claims, 1 Drawing Sheet

ULTRASONIC WIRE BONDER AND TRANSDUCER IMPROVEMENTS

BACKGROUND

The present invention relates generally to wire bonders, and more particularly, to improved ultrasonic transducers for use in ultrasonic wire bonders.

An ultrasonic bonder is comprised of an ultrasonic transducer into which a bonding tool is transversely secured that is used to ultrasonically bond wires to integrated circuits and substrates, and the like. The ultrasonic transducer includes piezoelectric discs that are excited by an alternating voltage to axially move the transducer and consequently "excite" the bonding tool to have a transverse motion (a vibrating reed).

All ultrasonic transducers used in currently available wire bonders cream this vibration at the the bonding tool end of the transducer. The end of the transducer opposite the bonding tool extends into a cylindrical mounting surface or mates with a flat-face mounting surface. A node of the sinusoidal motion is located at the mounting surface and an anti-node is formed at the bonding tool end of the transducer. At the node, axial movement is (ideally) zero while radial movement is a maximum. This corresponds to Poisson's ratio—the ratio of lateral strain to longitudinal strain for a material subjected to uniform longitudinal stresses within a proportional limit.

However, in conventional mounting arrangements for the transducer, the radial movement (strain) acts on mating surfaces of the transducer and mounting surface. The degree of restraint the mount exhibits affects the ultrasonic performance of the transducer. The present invention relieves this restraint, allowing unimpeded ultrasonic movement, better efficiency, and wire bond repeatability.

Furthermore, in conventional ultrasonic transducers, wear occurs in a tool hole in which the bonding tool is secured. This is a result of clamping the bonding tool in the tool hole only at the middle where it is free to rock and lose ultrasonic energy. The clamping force in conventional ultrasonic transducers is perpendicular to the direction of applied ultrasonic motion. The present invention substantially eliminates tool hole wear in the transducer.

Therefore it is an objective of the present invention to provide for an improved ultrasonic wire bonder. It is a further objective of the present invention to provide for an improved ultrasonic transducer for use in ultrasonic wire bonders that substantially eliminates bonding tool-hole wear and improve transducer mounting to provide unimpeded ultrasonic movement, better efficiency, and wire bond repeatability. It is a further objective of the present invention to provide for an axial mounting arrangement for the bonding tool of the wire bonder. It is a further objective of the present invention to provide for driver-node mounting for the transducer in the wire bonder.

SUMMARY OF THE INVENTION

In order to meet the above and other objectives, the present invention provides for improved ultrasonic wire bonders, and improvements to ultrasonic wire bonding transducers that are used with such ultrasonic wire bonders. These improvements include driver-node mounting of the ultrasonic transducer and three-point clamping of the bonding tool in the ultrasonic transducer.

The driver-node mounting of the transducer is achieved by mounting it in the ultrasonic bonder such that a ¾—wavelength distance is created between the mounting surface for the transducer and a distal end of the transducer at a location where the bonding tool is disposed. Driver-node mounting, compared with conventional first-transducer-node mounting, provides a mechanical advantage in the wire bonder. The driver-node mounting aspect of the present invention provides for a shorter overall transducer and concentrates the mass at the driver end for less tool impact. The driver-node mounting aspect of the present invention also reduces manufacturing variables related to achieving a one-half wavelength distance between the driver node and the transducer node.

Three-point mounting is achieved by using a set screw, and more particularly a soft point set screw, opposite a drilled-out back wall of the transducer that is used to secure the bonding tool in the distal end of the transducer. The set screw directly secures the bonding tool or engages a clamping shoe that radially secures the bonding tool to the distal end of the transducer. As a consequence, rigid clamping of the bonding tool is achieved. Therefore, the clamping force exerted on the bonding tool is in line with the ultrasonic motion imparted to the bonding tool. The present clamping arrangement improves the transfer of ultrasonic energy that excites the bonding tool into transverse (flexural) vibration.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
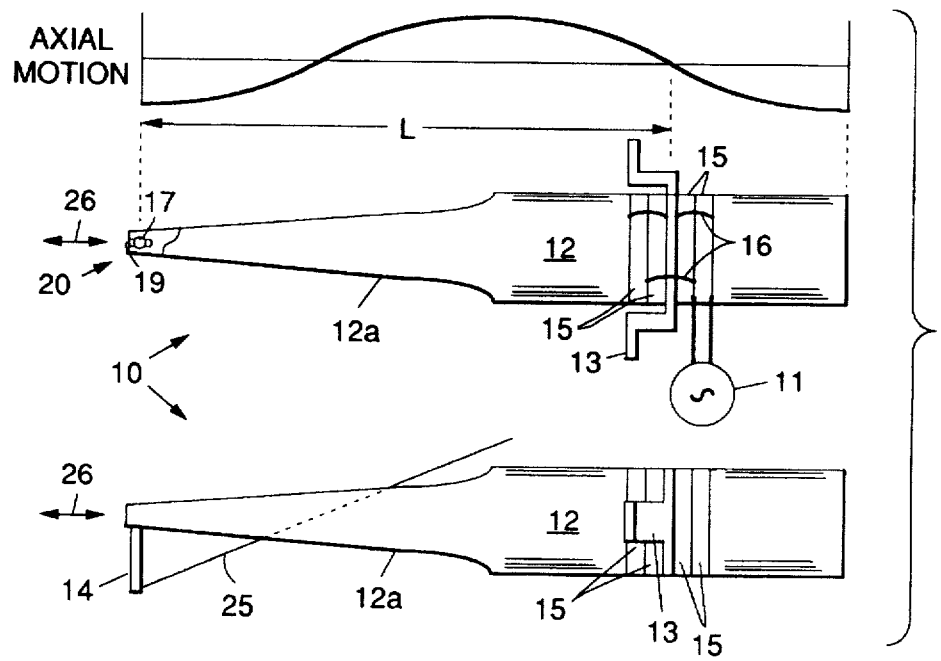
FIG. 1 illustrates top and side views of an ultrasonic wire bonder in accordance with the present invention and a graph illustrating motion of its ultrasonic transducer.

Referring to the drawing figures, FIG. 1 illustrates top and side views of an ultrasonic wire bonder 10 in accordance with the present invention. The ultrasonic wire bonder 10 may be a model 2470 ultrasonic wire bonder manufactured by the assignee of the present invention, for example. The ultrasonic wire bonder 10 is comprised of an voltage source 11, a wire bonding transducer 12, and a bonding tool 14 that is secured adjacent a distal end of the transducer 12.

The wire bonding transducer 12 includes a transducer horn 12a, a mounting bracket 13 that is used to secure the transducer 12 to a movable bonding head or vertical axis sliding mechanism (not shown) of the bonder 10 that permits vertical movement of the transducer 12, and a plurality of piezoelectric discs 15. The plurality of piezoelectric discs 15 have positive and negative electrodes that are appropriately coupled together (illustrated by conductive straps 16) that are excited by an alternating voltage from the voltage source 11 to axially move the transducer 12. The plurality of piezoelectric discs 15 are stacked such that a predetermined amount of axial movement is created in the transducer horn 12a. As a result of the axial movement of the transducer horn 12a, the bonding tool 14 is driven into transverse motion (bending or whipping). The graph in FIG. 1 illustrates axial motion of the transducer 12 created by the piezoelectric discs 15. The anti-node present at the location of the bonding tool 14 drives the tool 14 into transverse motion.

Bonding wire 25 is fed through holes in the bonding transducer horn 12a and bonding tool 14 so that it protrudes from an exposed end of the bonding tool 14. Clamping and wire feeding mechanisms (not shown) are provided to feed the wire to achieve bonding in a conventional manner.

The voltage source 11 provides a high frequency voltage (60 KHz typical) to the plurality of piezoelectric discs 15 of the wire bonding transducer 12 and oscillation of the bonding tool 14 is achieved at a predetermined wavelength. The voltage source 11 provides voltage to the plurality of piezoelectric discs 15 such that the distal end of the transducer 12 moves in a direction illustrated by the double-headed arrow 26.

The wire bonding transducer horn 12a is comprised of an elongated tapered shaft having a screw hole (not shown) located in an end adjacent to the mounting bracket 13. The wire bonding transducer 12 is secured to the mounting bracket 13 by means of a screw (not shown) that is inserted into the screw hole and tightened to secure the mounting bracket 13 between the stacked piezoelectric discs 15.

The bonding tool 14 is secured in a transverse hole 17 at the distal end of the wire bonding transducer 12 by means of an axially disposed set screw 18 disposed in an axial screw hole 19. The axially disposed set screw 18 used to secure the bonding tool 14 comprises one aspect of the present invention. The wire bonding transducer 12 is secured to the mounting bracket 13 such that it has an extended length equal to ¾ of the predetermined wavelength. A predetermined distance (L) that the wire bonding transducer 12 extends from the mounting bracket 13 comprises a second aspect of the present invention.

The present invention thus provides for two improvements to the ultrasonic wire bonder 10: locating the mounting bracket 13 between the piezoelectric discs 15 such that the bonding tool 14 is located a distance from the mounting bracket 13 equal to ¾ of the predetermined wavelength, referred to as driver-node mounting, and axial securing of the bonding tool 14 in the distal end of the transducer 12.

The driver-node mounting of the transducer 12 is achieved by mounting it in the ultrasonic bonder 10 such that the transducer 12 extends a ¾—wavelength distance (L) between the mounting bracket 13 and the distal end of the transducer 12 at which the bonding tool 14 is disposed. As a result, vibrational problems caused by the transducer 12 not being located at the node are eliminated. Driver-node mounting, compared with conventional fast-transducer-node mounting, is a mechanical advantage in the wire bonder 10. The driver-node mounting aspect of the present invention provides a shorter overall transducer 12 and concentrates the mass at the driver end (adjacent the mounting bracket 13) to provide for less tool impact. The driver-node mounting aspect of the present invention also reduces manufacturing variables encountered when attempting to achieve a one-half wavelength distance between the driver node and the transducer node.

Figure 2:
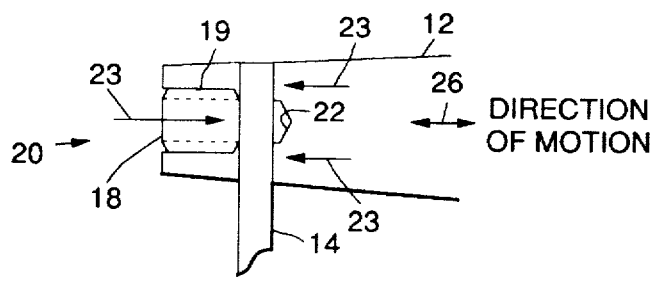
FIG. 2 illustrates a first embodiment of a mounting arrangement for a bonding tool employed in the ultrasonic wire bonder of FIG. 1.
Figure 3:
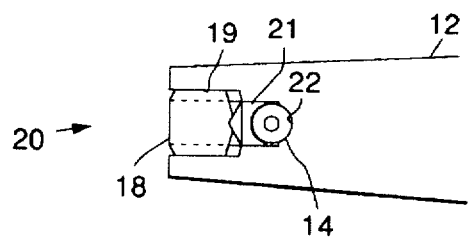
FIG. 3 illustrates a second embodiment of a mounting arrangement for the bonding tool employed in the ultrasonic wire bonder of FIG. 1.
Figure 4:
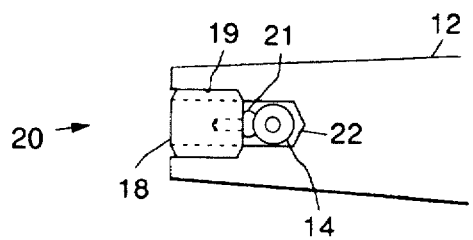
FIG. 4 illustrates a third embodiment of a mounting arrangement for the bonding tool employed in the ultrasonic wire bonder of FIG. 1.

The axial securing aspect of the present invention will be discussed in more detail with reference to FIGS. 2–4. FIG. 2–4 illustrates three embodiments of mounting arrangements 20 in accordance with the present invention that may be used to secure the bonding tool 14 in the transducer 12.

Referring to FIG. 2, three-point mounting is achieved by using the set screw 18, and more particularly a soft point set screw 18, opposite a drilled-out back wall 22 of the transducer 12. The set screw 18 directly secures the bonding tool 14 that secures the bonding tool 14 in the transducer 12. As a consequence, rigid clamping of the bonding tool 14 is achieved using three points, illustrated by arrows 23 shown in FIG. 2.

FIGS. 3 and 4 illustrate second and third embodiments of mounting arrangements 20 for the bonding tool 14 employed in the ultrasonic wire bonder 10 of FIG. 1. In FIGS. 3 and 4, the set screw 18 engages a clamping shoe 21 that radially secures the bonding tool 14 in the transducer 12. The clamping shoe 21 has a cylindrical surface (or other predetermined surface shape) that mates with an exterior surface of the bonding tool 14. Rigid clamping of the bonding tool 14 is achieved using the clamping arrangements 20 shown in FIGS. 3 and 4. Using any of the present clamping arrangements 20, the clamping force exerted on the bonding tool 14 is in line with the ultrasonic motion imparted to the bonding tool 14. The above-described clamping arrangements 20 for the bonding tool 14 improve the transfer of ultrasonic energy that excites the bonding tool 14 into transverse (flexural) vibration.

Ultrasonic transducers 12 and wire bonders 10 have been built using the features disclosed herein, and have performed with high output and more consistent bonding results.

Thus there has been described new and improved ultrasonic wire bonders and ultrasonic transducers for use in such ultrasonic wire bonders. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. An ultrasonic wire bonder comprising:

a voltage source;

a wire bonding transducer comprising a mounting bracket and a plurality of piezoelectric discs that are electrically coupled to the voltage source and that are excited by the voltage source to produce axial motion of the transducer whose motion has a predetermined wavelength, and wherein the transducer has a predetermined length between the mounting bracket and a distal end thereof that is equal to ¾ of the predetermined wavelength, and wherein the mounting bracket and a plurality of piezoelectric discs are centered about a vibrational node of the transducer; and a bonding tool secured in the wire bonding transducer adjacent the distal end thereof.

2. The ultrasonic wire bonder of claim 1 wherein the wire bonding transducer comprises a transverse hole adjacent the distal end into which the bonding tool is secured.

3. The ultrasonic wire bonder of claim 2 further comprising an axially disposed set screw disposed in an axial screw hole adjacent the distal end of the transducer for securing the bonding tool in the wire bonding transducer and wherein a clamping force is exerted on the bonding tool is in line with the ultrasonic motion imparted to the bonding tool.

4. The ultrasonic wire bonder of claim 3 wherein the set screw comprises a soft point set screw.

5. An ultrasonic wire bonder comprising:

a voltage source;

a wire bonding transducer comprising a mounting bracket and a plurality of piezoelectric discs that are electrically coupled to the voltage source and that are excited by the voltage source to produce axial motion of the transducer whose motion has a predetermined wavelength, and wherein the transducer has a predetermined length between the mounting bracket and a distal end thereof that is equal to ¾ of the predetermined wavelength, and wherein the transducer comprises a transverse hole adjacent the distal end into which the bonding tool is secured;

a bonding tool secured in the wire bonding transducer adjacent the distal end thereof; and an axially disposed set screw disposed in an axial screw hole adjacent the distal end of the transducer for securing the bonding tool in the wire bonding transducer and wherein a clamping force is exerted on the bonding tool is in line with the ultrasonic motion imparted to the bonding tool; and a clamping shoe disposed between the set screw and the bonding tool.

6. The ultrasonic wire bonder of claim 5 wherein the clamping shoe has a surface that mates with an exterior surface of the bonding tool.

7. An ultrasonic wire bonder comprising:

a voltage source;

a wire bonding transducer comprising a mounting bracket and a plurality of piezoelectric discs that are electrically coupled to the voltage source and that are excited by the voltage source to product axial motion of the transducer, and that has axially disposed set screw disposed in an axial screw hole adjacent a distal end of the transducer and a drilled out back wall opposite the set screw, and a bonding tool secured in the wire bonding transducer adjacent the distal end thereof by means of the set screw, and wherein clamping force exerted on the bonding tool is in line with the ultrasonic motion imparted to the bonding tool.

8. The ultrasonic wire bonder of claim 7 wherein the set screw comprises a soft point set screw.

9. The ultrasonic wire bonder of claim 7 further comprising a clamping shoe disposed between the set screw and the bonding tool.

10. The ultrasonic wire bonder of claim 9 wherein the clamping shoe has a surface that mates with an exterior surface of the bonding tool.

11. The ultrasonic wire bonder of claim 7 wherein the wire bonding transducer has a length between the mounting bracket and its distal end equal to ¾ of the predetermined wavelength.

12. In an ultrasonic wire bonder that comprises a voltage source 11, a wire bonding transducer including a mounting bracket and a plurality of piezoelectric discs that are electrically coupled to the voltage source and that are excited by the voltage source to produce axial motion of the transducer, and a bonding tool secured in the wire bonding transducer adjacent an end thereof distal from the mounting bracket, wherein the improvement comprises:

an ultrasonic wire bonding transducer wherein the mounting bracket and the bonding tool are separated by a predetermined distance that is equal to ¾ of the predetermined wavelength, and wherein the mounting bracket and a plurality of piezoelectric discs are centered about a vibrational node of the transducer.

13. The ultrasonic wire bonding transducer of claim 12 further comprising an axially disposed set screw disposed in an axial screw hole adjacent the distal end of the transducer for securing the bonding tool in the wire bonding transducer and which provides for three-point mounting of the bonding tool and wherein clamping force exerted on the bonding tool is in line with the ultrasonic motion imparted to the bonding tool.

14. The ultrasonic wire bonding transducer of claim 13 wherein the set screw comprises a soft point set screw.

15. The ultrasonic wire bonding transducer of claim 13 further comprising a clamping shoe disposed between the set screw and the bonding tool.

16. The ultrasonic wire bonding transducer of claim 15 wherein the clamping shoe has a surface that mates with an exterior surface of the bonding tool.

17. An ultrasonic wire bonder comprising:

a voltage source;

a wire bonding transducer comprising a mounting bracket and a plurality of piezoelectric discs that are electrically coupled to the voltage source and that are excited by the voltage source to product axial motion of the transducer, and that has axially disposed set screw disposed in an axial screw hole adjacent a distal end of the transducer;

a bonding tool secured in the wire bonding transducer adjacent the distal end thereof by means of the set screw, and wherein clamping force exerted on the bonding tool is in line with the ultrasonic motion imparted to the bonding tool, and a clamping shoe disposed between the set screw and the bonding tool.

18. In an ultrasonic wire bonder that comprises a voltage source, a wire bonding transducer including a mounting bracket and a plurality of piezoelectric discs that are electrically coupled to the voltage source and that are excited by the voltage source to produce axial motion of the transducer, and a bonding tool secured in the wire bonding transducer adjacent an end thereof distal from the mounting bracket, wherein the improvement comprises:

an ultrasonic wire bonding transducer wherein the mounting bracket and the bonding tool are separated by a predetermined distance that is equal to ¾ of the predetermined wavelength and an axially disposed set screw disposed in an axial screw hole adjacent the distal end of the transducer for securing the bonding tool in the wire bonding transducer and which provides for three-point mounting of the bonding tool and wherein clamping force exerted on the bonding tool is in line with the ultrasonic motion imparted to the bonding tool.

19. The ultrasonic wire bonding transducer of claim 18 wherein the set screw comprises a soft point set screw.

20. The ultrasonic wire bonding transducer of claim 18 further comprising a clamping shoe disposed between the set screw and the bonding tool.

21. The ultrasonic wire bonding transducer of claim 20 wherein the clamping shoe has a surface that mates with an exterior surface of the bonding tool.

* * * * *

UNITED STATES PATENT AND TRADEMARK OFFICE
CERTIFICATE OF CORRECTION

PATENT NO. : 5,603,445
DATED : February 18, 1997
INVENTOR(S) : William H. Hill et al.

It is certified that error appears in the above-indentified patent and that said Letters Patent is hereby corrected as shown below:

Cover Page: insert --Assignee: Palomar Technologies Corporation, Carlsbad, Calif.--.

Cover Page: insert --Attorney, Agent, or Firm - Rodney F. Brown--.

Column 1, line 17 : delete "cream" and insert --create--.

Column 3, line 53 : delete "fast" and insert --first--.

Signed and Sealed this

Seventeenth Day of June, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,603,445
DATED : Feb. 18, 1997
INVENTOR(S) : William H. Hill et al.

It is certified that error appears in the above-indentified patent and that said Letters Patent is hereby corrected as shown below:

Column 5, Claim 7, line 29: delete "product" and insert -- produce --.

Signed and Sealed this

Fifteenth Day of July, 1997

Attest:

BRUCE LEHMAN

Attesting Officer        Commissioner of Patents and Trademarks